United States Patent
Xiu et al.

(10) Patent No.: US 7,372,340 B2
(45) Date of Patent: May 13, 2008

(54) PRECISION FREQUENCY AND PHASE SYNTHESIS WITH FEWER VOLTAGE-CONTROLLED OSCILLATOR STAGES

(75) Inventors: Liming Xiu, Plano, TX (US); Zhihong You, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/250,758

(22) Filed: Oct. 14, 2005

(65) Prior Publication Data

US 2006/0145772 A1 Jul. 6, 2006

Related U.S. Application Data

(60) Provisional application No. 60/641,314, filed on Jan. 3, 2005.

(51) Int. Cl.
*H03B 27/00* (2006.01)
(52) U.S. Cl. ............. 331/45; 331/1 A; 331/16; 331/57; 375/376; 327/156
(58) Field of Classification Search ............. 331/45, 331/74, 1 A, 16, 57; 327/156; 375/376
See application file for complete search history.

(56) References Cited

U.S. PATENT DOCUMENTS 6,329,850 B1 * 12/2001 Mair et al. ............. 327/107

| | | |
|---|---|---|
| 6,940,937 B2 | 9/2005 | Xiu et al. |
| 2004/0008805 A1 | 1/2004 | Xiu et al. |
| 2005/0162552 A1 | 7/2005 | Xiu et al. |

OTHER PUBLICATIONS

BEST, Phase-Locked Loops: Design, Simulation, and Applications (McGraw-Hill, 1997), pp. 177-199.
Mair et al., "An Architecture of High-Performance Frequency and Phase Synthesis", J. Solid State Circ., Vo. 35, No. 16 (IEEE, Jun. 2000), pp. 835-846.

* cited by examiner

*Primary Examiner*—Arnold Kinkead
(74) *Attorney, Agent, or Firm*—J. Dennis Moore; W. James Brady, III; Frederick J. Telecky, Jr.

(57) ABSTRACT

A clock synthesis circuit) including a phase-locked loop and one or more frequency synthesis circuits is disclosed. The phase-locked loop includes a voltage-controlled oscillator (VCO) having a sequence differential stages o produce equally spaced clock phases. The frequency synthesis circuit includes a sequence of adder-and-register units that select one of the VCO clock phases. An output multiplexer receives each of the selected clock phases, and selects among these clock phases in sequence; the output of the multiplexer is applied to a first toggle flip-flop that changes state in response to rising edge transitions at the output of the multiplexer. A second toggle flip-flop is clocked by the output of the first toggle flip-flop, itself toggling in response to rising edge transitions at the output of the first toggle flip-flop. One or more additional flip-flops can be similarly connected in sequence. The additional toggle flip-flop enables the VCO to be formed with fewer stages for a given frequency resolution, reducing noise and thus frequency error.

4 Claims, 6 Drawing Sheets

PRECISION FREQUENCY AND PHASE SYNTHESIS WITH FEWER VOLTAGE-CONTROLLED OSCILLATOR STAGES

CROSS-REFERENCE TO RELATED APPLICATIONS

This application claims priority, under 35 U.S.C. §119(e), of Provisional Application No. 60/641,314, filed Jan. 3, 2005.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to clock generation circuits.

As is fundamental in the art, many modern electronic systems include numerous integrated circuits that operate in conjunction with one another. For example, consumer-oriented systems such as televisions and home theaters include video decoders for decoding an input video signal into digital video output signals that are synchronized with a synchronization pulse contained within the incoming video signal itself. Modern spread-spectrum communications transmitters and receivers require the generation of high-frequency clock signals for the modulation and demodulation, respectively, of signals over the multiple subchannels of the spread spectrum bandwidth. In these and other electronic systems, the generation of periodic signals for clocking the operation of circuit functions based upon a system clock or synchronization pulse, is a common and often critical function.

A conventional approach for generating periodic signals based upon a reference clock utilizes the well-known phase-locked loop ("PLL"). In general, PLL circuits operate by comparing the time at which an edge of a reference clock is received with a corresponding edge of an internally generated clock. If a significant delay between these two edges is detected, the generation of the internal clock is adjusted to more closely match the received reference clock. In conventional analog PLLs, the frequency of a voltage controlled oscillator is adjusted by a filtered signal from a phase detector that compares system and chip clocks, so that the instantaneous frequency of the internal chip clock is advanced or retarded depending upon whether the chip clock lags or leads the system clock. Analog PLLs adjust the phase of the chip clock in a substantially continuous manner in response to a phase difference between the internal chip clock and the system clock. This smooth operation generally depends upon the filtering of the output of the phase detector circuit, but can be made quite well-behaved in many implementations. Additionally, by inserting frequency dividers in the forward and feedback loops, analog PLLs can be used to generate periodic signals of a selectable frequency multiple of the input reference clock.

Several types of digital PLLs (DPLLs), in which some of the signals communicated around the loop are in digital form, are known in the art. A specific class of DPLL is the so-called "all-digital" PLL (ADPLL), in which all signals in the loop are digital. Known implementations of ADPLLs include divide-by-N counters, increment-decrement (ID) counters, and digital waveform synthesizers. Several conventional ADPLL designs are described in Best, *Phase-Locked Loops: Design, Simulation, and Applications* (McGraw-Hill, 1997), pp. 177-199.

By way of further background, clock generator circuits based on a phase-locked loop (PLL) are described in Mair and Xiu, "An Architecture of High-Performance Frequency and Phase Synthesis", *J. Solid State Circ.*, Vo. 35, No. 16 (IEEE, June, 2000), pp. 835-46, and in U.S. Pat. No. 6,329,850 B1, issued Dec. 11, 2001 and commonly assigned herewith, both documents incorporated herein by this reference. In these "flying-adder" clock generation circuits, the voltage controlled oscillator (VCO) of the PLL produces a plurality of evenly-spaced output phases at a frequency that is locked to a reference clock. A register stores a digital value that selects the desired phase to be applied to the clock input of a toggle flip-flop from which the output clock is generated. A frequency synthesis circuit adds integer and fraction portions of an incoming frequency selection value to the current contents of the register. The fraction portion of the frequency selection value permits a time-averaged clock frequency to be produced with more precision than would be attained by the integer portions selecting the multiple VCO output phases. This article and U.S. Patent also describe alternative realizations, including multiple frequency synthesis circuits based upon the same PLL and the generation of a phase-shifted secondary output from a phase synthesis circuit that is slaved to the frequency synthesis circuit. Additional performance is obtained by providing separate paths for producing the leading and trailing edges of the output clock.

By way of further background, U.S. Patent Application Publication No. US 2004/0008805 A1, published Jan. 15, 2004, from copending and commonly assigned application Ser. No. 10/376,453, filed Feb. 26, 2003, and incorporated herein by this reference, describes a phase-locked loop using a flying-adder frequency synthesizer, in which a central processing unit generates a feedback divide integer in the feedback loop from the VCO output (which provides the multiple phases to the flying-adder). Because the CPU generates the feedback ratio, the flying-adder frequency synthesizer can be designed to use only integer values, effectively eliminating jitter while still providing low frequency error.

By way of further background, U.S. Patent Application Publication No. US 2005/0162552 A1, published Jul. 28, 2005, from copending and commonly assigned application Ser. No. 10/829,770, filed Apr. 22, 2004, and incorporated herein by this reference, describes the application of a digital-control oscillator based on a flying-adder frequency synthesizer in generating a clock signal that is at an extremely large frequency multiple relative to the input reference signal. Such clock signals are useful in many systems applications, for example in video decoders. In this implementation, the flying-adder architecture provides such high frequency-multiple clock signals to be generated, while also providing the ability to finely and precisely tune the phase of the clock signals.

By way of further background, U.S. Pat. No. 6,940,937 B2, issued Sep. 6, 2005, commonly assigned herewith and incorporated herein by this reference, describes another flying-adder clock generation circuit, based on the flying-adder architecture of the Mair and Xiu article and U.S. Pat. No. 6,329,850 B1. In particular, this copending application describes a clock generation circuit in which two or more frequency synthesis paths terminate at the inputs of a multiplexer, the output of which toggles a toggle mode bistable multivibrator (T flip-flop). Sequential selection of the synthesis paths is controlled in a synchronized manner with the output of the circuit, so that the synthesis path outputs sequentially toggle the flip-flop. In this way, the number of synthesis paths can be increased arbitrarily, with the scaling limited by the performance of control circuits for the output multiplexer. The propagation delay paths of each synthesis path can then extend to the multiple periods of the output clock, making higher output frequency possible. In addition, the toggle signal operates as a double-frequency clock signal.

These flying-adder frequency and phase synthesis circuits have been observed to provide excellent performance, with the later advances described above resulting in scalability of the architecture, as well as improved performance and reliability. However, it has been observed, in connection with this invention, that the most significant source of noise in these circuits is design and layout mismatch among the multiple VCO stages. This noise directly causes frequency error in the output clock signal. Based on this observation, it has been discovered, in connection with this invention, that it is desirable to reduce the number of VCO stages in order to reduce the severity of this mismatch, and thus the frequency error; in addition, this reduction in the number of VCO stages would also beneficially reduce power consumption of the circuit. However, simply reducing the number of VCO stages would correspondingly reduce the number of available phases applied to the flying-adder synthesizer, and thus reduce the resolution at which the frequency of the output clock signal may be selected. As such, the ability to improve the accuracy of the flying-adder frequency synthesis architecture in this way has not yet been available.

BRIEF SUMMARY OF THE INVENTION

It is therefore an object of this invention to provide a frequency synthesis circuit based on the flying-adder architecture in which frequency error is reduced without affecting the resolution of the circuit.

It is a further object of this invention to provide such a circuit in which the frequency error is reduced by reducing the number of VCO stages without adversely affecting the time resolution of the frequency synthesis.

It is a further object of this invention to provide such a circuit in which the flying-adder architecture can be readily scaled without reducing the number of available clock phases available for the flying-adder frequency synthesis.

Other objects and advantages of this invention will be apparent to those of ordinary skill in the art having reference to the following specification together with its drawings.

The present invention may be implemented into a frequency-synthesis circuit by providing multiple frequency synthesis paths that terminate at the inputs of a multiplexer, the output of which toggles a first toggle mode bistable multivibrator (T flip-flop). Each synthesis path selects among a number of available clock phases from a voltage-controlled oscillator, (VCO). Sequential selection of the synthesis paths is controlled in a synchronized manner with the output of the circuit, so that the synthesis path outputs sequentially toggle the flip-flop. An additional flip-flop stage is driven by the output of the first flip-flop, to substantially double the number of available clock phases from which each synthesis path can select, for a given number of VCO phases. Conversely, the number of VCO phases can be reduced by one-half without affecting the output time resolution.

DETAILED DESCRIPTION OF THE INVENTION

The present invention will be described in connection with its preferred embodiment, namely as implemented into a clock generator circuit such as may be used in many various system applications. Examples of such system applications include video decoders, communications systems such as modems and transceivers, and the like. Accordingly, it is to be understood that the following description is provided by way of example only, and is not intended to limit the true scope of this invention as claimed.

Figure 1:
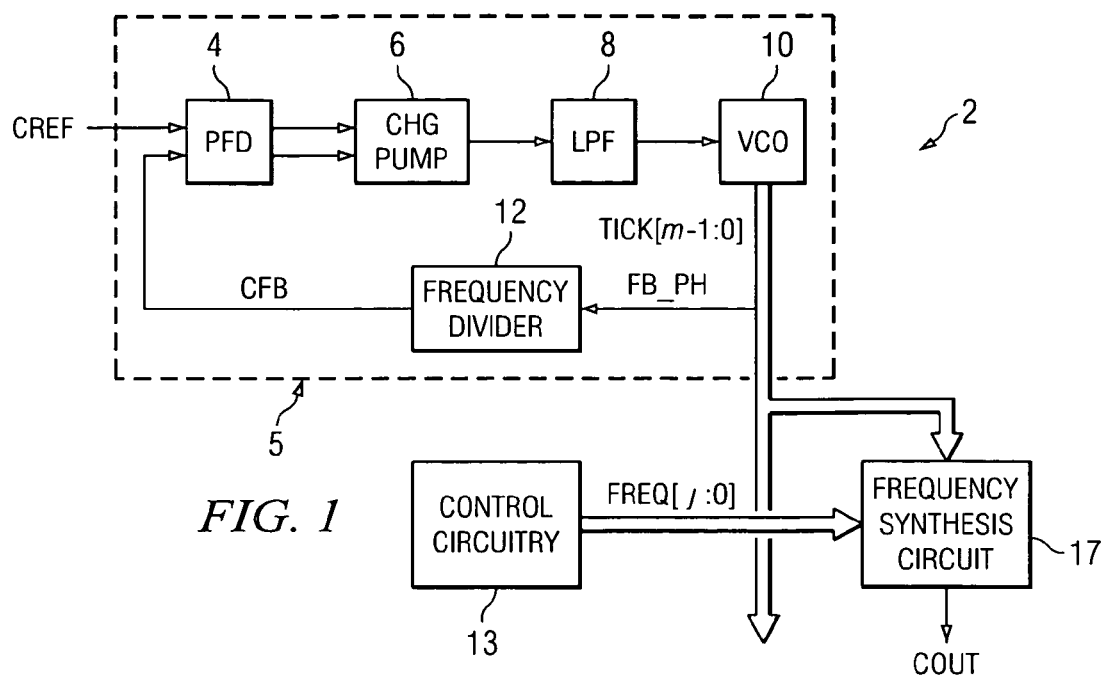
FIG. 1 is an electrical diagram, in block form, of a clock generation circuit according to the preferred embodiments of the invention.

Referring first to FIG. 1, the construction of clock generation circuit 2 according to a preferred embodiment of the present invention will now be described in general. Clock generation circuit 2 is a phase-locked loop (PLL) based clock circuit, and as such includes PLL 5 which generates multiple phases of a clock signal, phase-locked to a reference clock received on line CREF. Phase-frequency detector (PFD) 4 that compares the relative phases of this reference clock on line CREF with a feedback clock on line CFB, and drives charge pump 6 with a signal (differential signal in this example) in response to the phase difference between these clock signals. Charge pump 6, in the conventional manner, generates a voltage at its output corresponding to this phase difference. Low pass filter 8 filters the output voltage from charge pump 6 to apply a corresponding control voltage for voltage controlled oscillator (VCO) 10.

VCO 10 generates a periodic waveform at a frequency controlled by the filtered control voltage from low pass filter 8, based on the phase difference detected by PFD 4. According to this example, VCO 10 provides m equally-spaced clock phases on corresponding lines of bus TICK[m-1:0], each clock phase line within bus TICK having the same clock period. The duration of this clock period, and thus the delay time between successive ones of the m output clock phases, is controlled by the filtered control voltage based on the detected phase difference between reference clock CREF and clock feedback signal CFB. One of these m clock phases is forwarded as feedback to frequency divider 12 on line FB_PH; frequency divider 12 in turn generates clock feedback signal CFB to PFD 4, at a frequency divided down from that of the output clock phases on bus TICK. The multiple by which frequency divider 12 divides down the feedback clock phase on line FB_PH of course determines the relationship between the output frequency on bus TICK and the frequency of reference clock CREF.

The output clock phases on bus TICK are applied to one or more instances of frequency synthesis circuit 17. According to this embodiment of the invention, frequency synthesis circuit receives each of the m clock phases output by VCO, and also receives a digital frequency select signal on bus FREQ from control circuitry 13, which may be realized by a control register or other logic circuit within the integrated circuit or system within which clock generator circuit 2 is realized. Frequency synthesis circuit 17 generates an output clock signal on line COUT at a frequency corresponding to the value of the frequency select signal on bus FREQ. The construction of frequency synthesis circuit 17 according to the preferred embodiments will be described in further detail below. And, as mentioned above, multiple instances of frequency synthesis circuit 17 may be provided within clock generator circuit 2, each receiving a separate frequency select signal on a corresponding bus FREQ, so that each of these instances of frequency synthesis circuit 17 can generate a separate output clock signal at an individually controllable frequency.

Figure 2A:
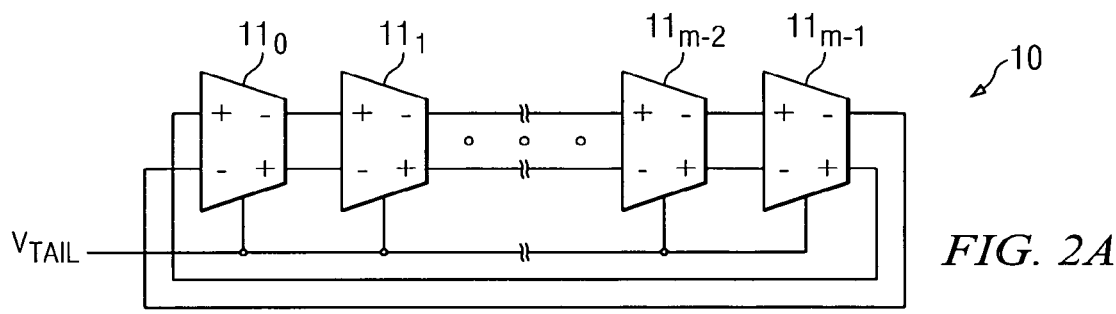
FIGS. 2a and 2b are electrical diagrams, in block and schematic form, of the construction of a voltage controlled oscillator (VCO) in the clock generation circuit of FIG. 1 according to the preferred embodiments of the invention.
Figure 2B:
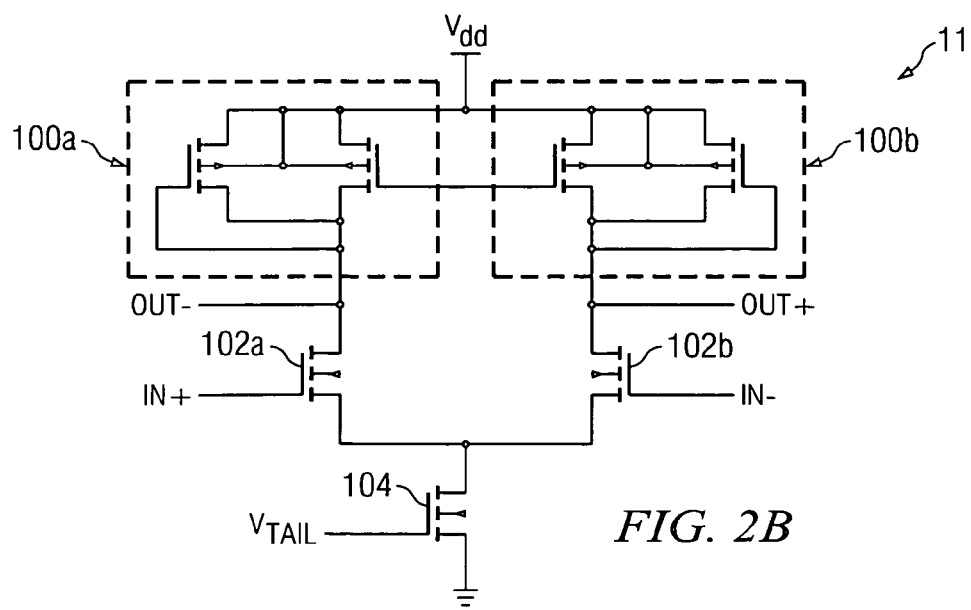

FIGS. 2a and 2b illustrate the construction of VCO 10 according to the preferred embodiments of the invention. According to this preferred construction, VCO 10 is constructed as a sequence of stages $11_0$ through $11_{m-1}$. As shown in FIG. 2a, each stage 11 is a differential delay stage, having positive and negative inputs and outputs. The positive and negative outputs of differential delay stages $11_0$ through $11_{m-1}$ are connected to the negative and positive inputs, respectively, of differential delay stages $11_1$ through $11_{m-1}$; oscillation is enabled by the positive and negative outputs of last differential delay stage $11_{m-1}$ being connected to the positive and negative inputs, respectively, of first differential delay stage $11_0$. Because each differential delay stage 11 has two outputs (180° out of phase from one another), a sequence of m/2 differential delay stages 11 will provide the m clock phase outputs on bus TICK[m-1:0].

FIG. 2b illustrates the construction of an exemplary differential delay stage 11, by way of example; it is contemplated that each of delay stages 11 within VCO 10 is preferably similarly constructed. Each differential delay stage 11 includes two legs. One leg includes load 100a and pull-down device 102a, while the other includes load 100b and pull-down device 102b. Each of loads 100 include, in this example, a pair of p-channel metal-oxide-semiconductor (MOS) transistors having their source-to-drain paths connected in parallel between a power supply voltage $V_{dd}$ and the drain of their corresponding n-channel MOS pull-down device 102; the gates of one transistor of each load 100 are connected in common to the drain of its corresponding pull-down device 102; the gates of the other transistors in loads 100a, 100b are connected in common with one another. The source of each of pull-down devices 102a, 102b is connected to the drain of tail n-channel MOS transistor 104, which has its source at ground and its gate receiving a voltage $V_{TAIL}$. The gates of pull-down devices 102a, 102b correspond respectively to the positive and negative inputs IN+, IN− of VCO 30, and the drains of pull-down devices 102a, 102b correspond respectively to the negative and positive outputs OUT−, OUT+ of VCO 10.

In operation, the voltage $V_{TAIL}$ corresponds to the filtered voltage from PFD 4 via LPF 8 (FIG. 1). Voltage $V_{TAIL}$ is applied to each of differential delay stages 11, and controls the duration of the delay in each differential delay stage 11 by limiting the pull-down current through the one of pull-down devices 102a, 102b that is turned on by the signal at its corresponding gate (IN+, IN−). As noted above, the connection of the inputs and outputs of differential delay stages 11 ensures that their outputs oscillate at a frequency determined by the pull-down currents, as these currents determine the switching time of each differential delay stage 11. In this manner, the voltage $V_{TAIL}$ controls the frequency of oscillation of VCO 10, in conventional VCO manner.

As discussed above, it has been observed, according to this invention, that a significant if not dominant source of noise, and thus frequency error, in conventional VCO circuits and thus in conventional frequency synthesis circuits results from mismatch in the design and physical layout and construction among differential delay stages 11 in VCO 10, in this example. It has also been observed, as discussed above, that the severity of this mismatch corresponds to the number of delay stages 11 that form VCO 10; fewer delay stages 11 within a given VCO 10 will tend to reduce the mismatch, and thus the frequency error. But, as mentioned above, the number m of output clock phases on bus TICK depends directly on the number of delay stages 11 within VCO 10. And, in conventional PLL-based frequency synthesis circuits, the resolution of the circuit is reduced as the number of clock phases is reduced.

For purposes of understanding this invention the construction of an exemplary frequency synthesis circuit 77, as described in U.S. Pat. No. 6,940,937 B2, issued Sep. 6, 2005, commonly assigned herewith and incorporated herein by this reference, will now be described relative to FIG. 3. In this example, frequency synthesis circuit 77 includes four adder and register units $75_1$ through $75_4$. Referring to adder and register unit $75_1$, by way of example, one input of adder $70_1$ receives a thirty-two bit frequency select value on lines FREQ <31:0> from a control circuit or register. The output of adder $70_1$ is applied to thirty-two-bit register $72_1$, and the contents of register $72_1$ are fed back to a second input of adder $70_1$. As a result, adder $70_1$ accumulates the current value on lines FREQ <31:0> from iteration to iteration, when clocked by master clock signal CLK. Register $72_1$ stores this accumulated value as an integer portion and a fractional portion. The integer portion, for example the five most significant bits when selecting from thirty-two clock phases, is stored in register $74_1$ on a rising edge of a clock signal CLK1. The output of register $74_1$ is applied to the select input of multiplexer $76_1$, which receives multiple clock phases (e.g., thirty-two in number) from a conventional VCO at its input. Therefore, in response to the value stored in register $74_1$. multiplexer $76_1$ selects one of the available VCO clock phases for application to an input of multiplexer 78.

Adder and register units $75_2$, $75_3$, and $75_4$ are constructed similarly as one another, and select three other clock phases for application to output multiplexer 78. Adder and register units $75_2$, $75_3$, and $75_4$ derive different select values and are clocked by different clock signals CLK2, CLK3, CLK4, relative to one another and relative to adder and register unit $75_1$. In this example, adder and register unit $75_2$ adds a five-bit portion of the selection value on lines FREQ to the most significant five bits of its accumulated value, the integer portion of this accumulated value is stored when clocked by clock signal CLK2, and selects one of the available clock phases from the VCO for application to a corresponding input of multiplexer 78. Adder and register units $75_3$ and $75_4$ differ from one another in the particular five bits of lines FREQ that they each accumulate, and in the clock signal CLK3, CLK4 that clocks the storing of the sum in their registers $54_2$ through $54_4$, respectively. In this example, adder and register unit $75_3$ accumulates the sum of the value on lines FREQ<32:28> and the value on line FREQ<27>, and adder and register unit 754 accumulates the sum of lines FREQ<32:28> and FREQ<33:29>. In this way, adder and register units $75_1$ through $75_4$ select different ones of the VCO clock phases for application to multiplexer 78.

Multiplexer 78 selects one of the clock signals at its inputs for application to the clock input of D-type flip-flop 79. Flip-flop 79 is configured in toggle fashion, having its Q output connected to the D input via an inverter as shown. The output of frequency synthesis circuit 77, on line Z, is generated at the Q output of flip-flop 79; of course, a complementary clock signal is generated at the inverting output ($\overline{Q}$) of flip-flop 79 and may also be used by a system function. Multiplexer 78 selects one of its inputs to be forwarded to its output in response to a selection signal received from clock control circuit 73. Clock control circuit 73 selects the outputs of adder and register units $75_1$ through $75_4$ in sequence, and generates clock signals CLK1 through CLK4, in sequence as will be described below. The output of multiplexer 78 is also applied to the clock input of clock control circuit 73.

In its general operation, each of adder and register units $75_1$ through $75_4$ selects one of the VCO clock phases according to its accumulated value. During such time as multiplexer 78 is presenting the output of a given adder and register unit 75, a rising edge of the selected clock phase by that adder and register unit 75 will pass through multiplexer 78 to node T, at the clock input of flip-flop 79, effecting a transition of the clock signal at the output of flip-flop 79. In addition, this rising edge is also coupled to the clock input of clock control circuit 73, advancing the selection value applied to multiplexer 78 and causing a transition of the next clock signal in the sequence of clocks CLK1 through CLK4. But in this example, because of the toggle arrangement of flip-flop 79, successive transitions of flip-flop 79 are opposite in polarity. Accordingly, if a rising edge of clock signal Z occurs during the CLK1 quarter-cycle, then a falling edge of clock signal Z will occur during the CLK2 quarter-cycle; the CLK3 and CLK4 quarter-cycles will generate rising and falling edges, respectively.

Figure 4:
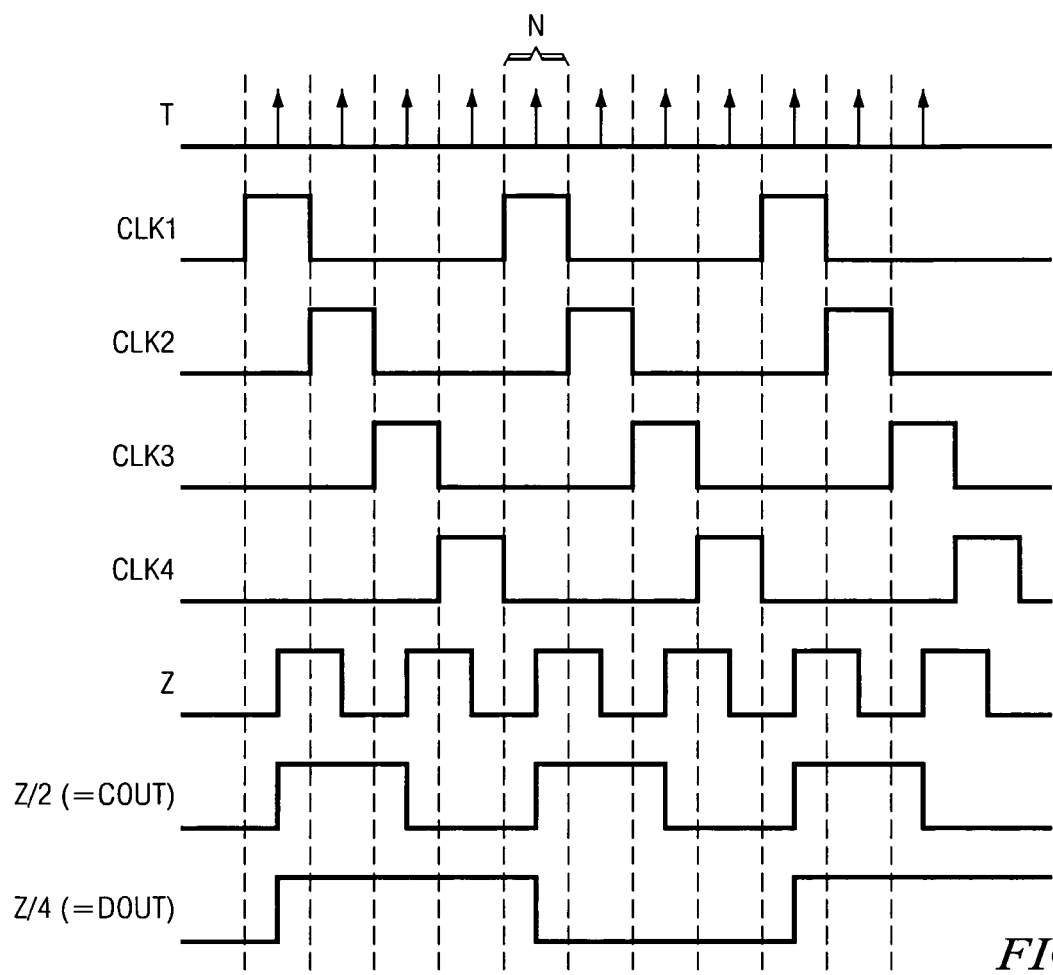
FIG. 4 is a timing diagram illustrating the relationship of various clock signals according to the preferred embodiments of the invention.

The timing diagram of FIG. 4 illustrates the general operation of frequency synthesis circuit 77. Prior to the selection of a specific clock phase from VCO 10, each of adder and register units 75 performs a sum-and-store operation (e.g., in its first register such as register $72_1$ in adder and register unit $75_1$), responsive to a clock signal on line CLK. Clock signal CLK can be any one of clock signals CLK1 through CLK4, so long as a sum-and-store operation is performed in each cycle. During each quarter-cycle of the sequence, one of clock signals CLK1 through CLK4 is driven active and the others are held inactive, thus causing multiplexer 78 to select the output of one of adder and register units 75. A rising edge of the VCO clock phase selected by that selected adder and register unit 75 in that quarter cycle will then toggle flip-flop 79, as shown on line T of FIG. 4. The resulting clock signal Z, which makes a transition in response to each toggle on line T, is shown in FIG. 4.

Figure 3:
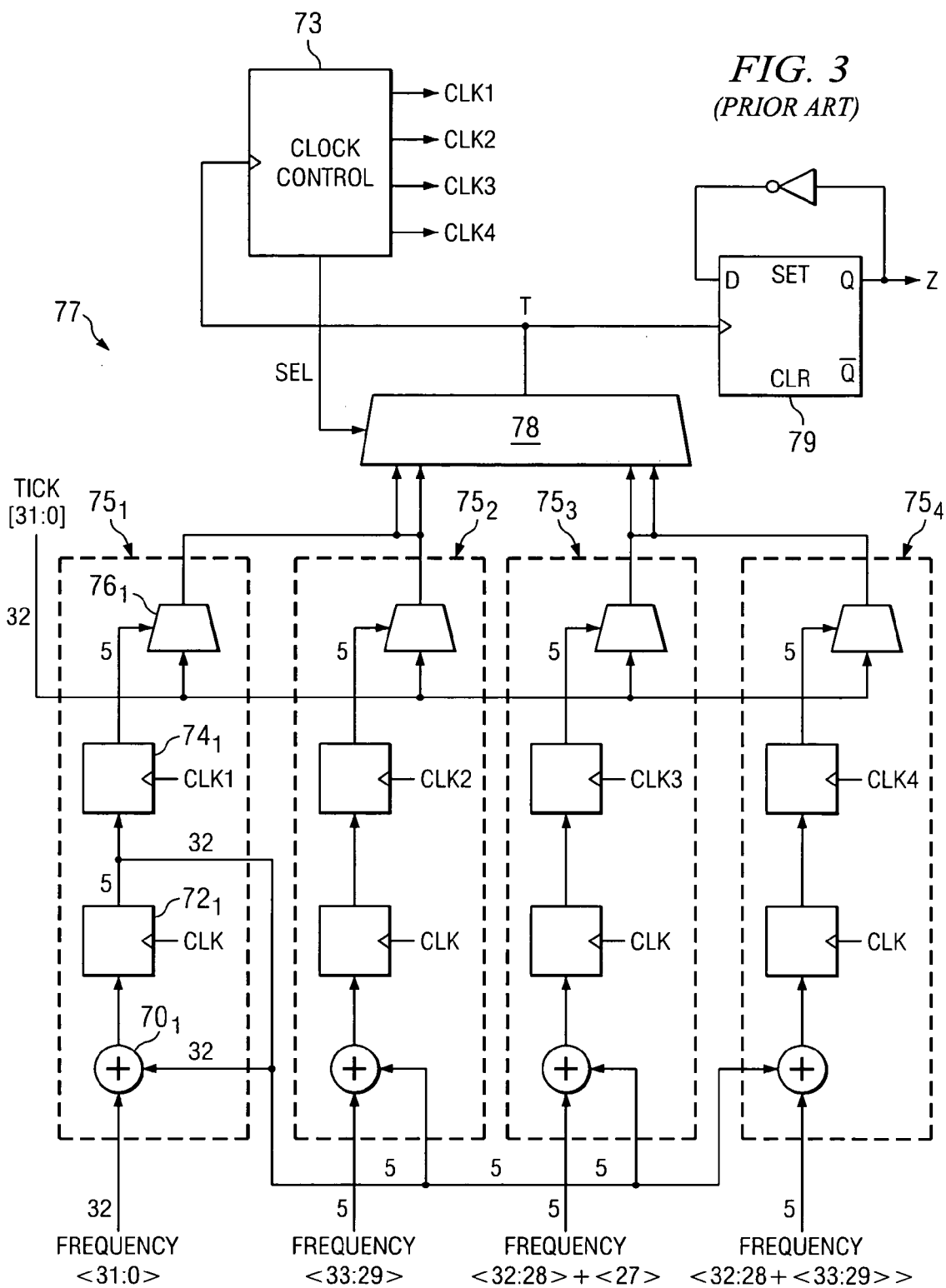
FIG. 3 is an electrical diagram, in block form, of a conventional frequency synthesis circuit.

In the example of FIGS. 3 and 4, the number of available clock phases from which to choose, within each quarter-cycle, is thirty-two. Accordingly, the maximum number of available phases for a cycle of output clock signal Z is sixty-four; thirty-two phases are available for the rising edge (in the CLK1, CLK3 quarter-cycles), and thirty-two phases are available for the falling edge (in the CLK2, CLK4 quarter-cycles). According to this embodiment of the invention, the frequency and duty cycle of output clock signal in the CLK1/CLK2 cycle is the same as that in the CLK3/CLK4 cycle, to minimize jitter. As described in the above-incorporated U.S. Pat. No. 6,940,937 B2, the four paths in frequency synthesis circuit 77 of FIG. 3 do not provide additional flexibility in generation of the output clock signal, but instead provide the important benefit of relaxing the timing requirements of the accumulate-and-store operations in each path.

According to this invention, one can consider frequency-divided output clock signals Z/2, Z/4, which are at one-half and one-fourth the frequency of output clock signal Z as shown in FIG. 4, as providing a larger number of available clock phases ("ticks", for purposes of this description) from which selections can be made. For example, if the desired output signal is half-frequency clock signal Z/2, the total number of ticks within each positive half-cycle of clock signal Z/2 is approximately 2N, where N is the available number of VCO clock phases, or ticks; as such, 4N ticks are contained within each full cycle of clock signal Z/2. Similarly, 4N ticks are available within each half-cycle of quarter-frequency clock signal Z/4, and 8N ticks within each full cycle of Z/4. Conversely, according to this invention, it has been realized that one could cut in half the number of ticks N within each phase of clocks CLK1 through CLK4, and utilize half-frequency output clock signal Z/2, to produce an output clock signal of the same relative resolution as that generated by frequency synthesis circuit 77 of FIG. 3. As will be described in further detail below, this realization results in reduced frequency error, and reduced power dissipation, by reducing the number of stages within VCO 10 as the number of available clock phases, or ticks, is reduced.

Figure 5:
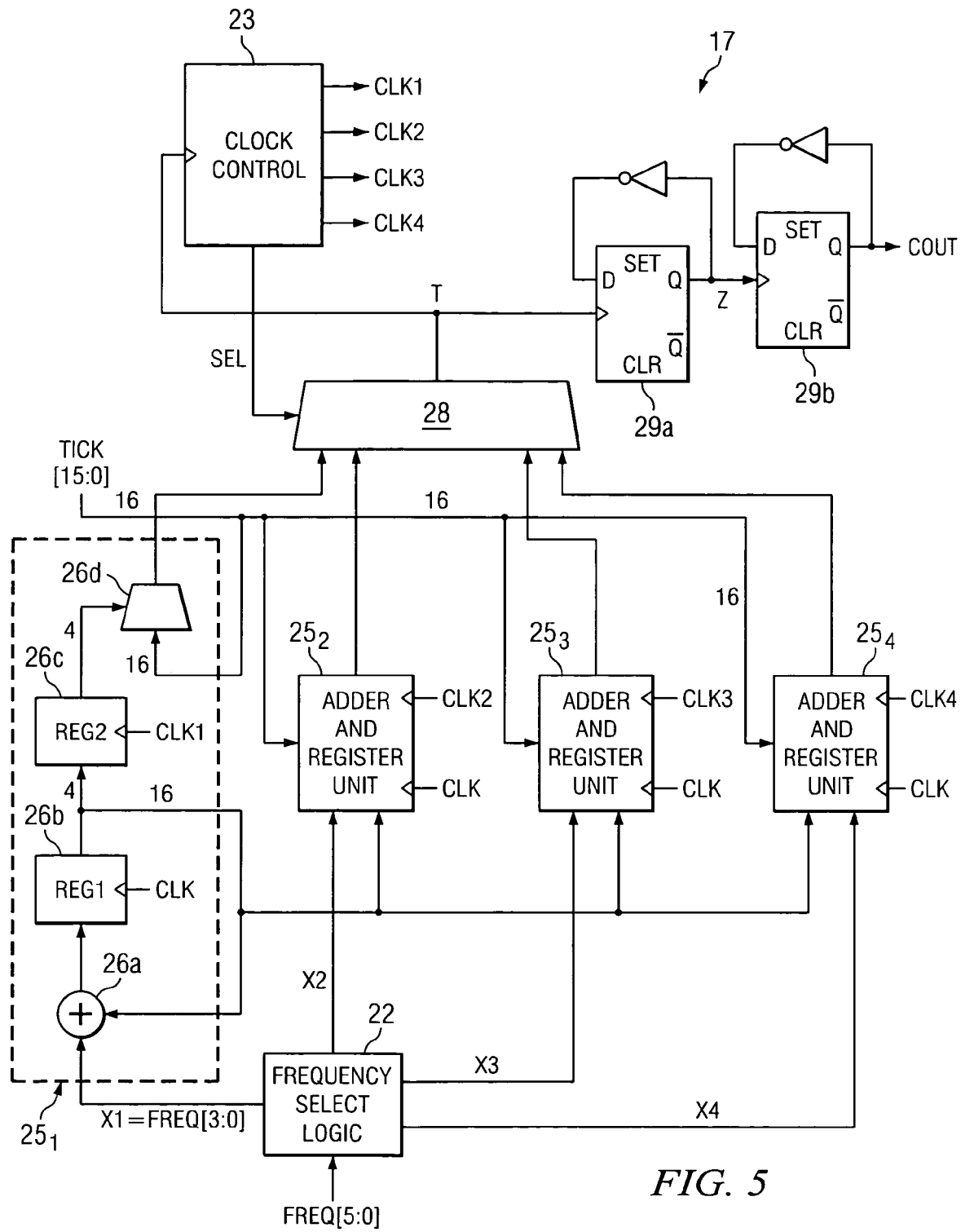
FIG. 5 is an electrical diagram, in block form, of a frequency synthesis circuit according to a first preferred embodiment of the invention.

Referring now to FIG. 5 in combination with FIG. 1, frequency synthesis circuit 17 according to a first preferred embodiment of the invention will now be described in detail. In this example, four adder paths are provided, each such path selecting one of the corresponding clock phases, or ticks, from VCO 10 (FIG. 1). In this reduced tick implementation, the number of available ticks from VCO 10 is sixteen (i.e., k=16), which is reduced by a factor of two from the thirty-two tick VCO output in the conventional example of FIG. 3.

According to this example, frequency select logic 22 receives a six-bit frequency select value on lines FREQ[5:0] from control logic control circuitry 13 (FIG. 1). Accumulating adder and register unit $25_1$ receives the sixteen VCO output clock phases from VCO 10, and also receives a four-bit value X1, corresponding to the four least significant bits of frequency control word FREQ[3:0], from frequency select logic 22. The value X1 carried on these four bits selects one of the sixteen ticks generated by VCO 10. Accumulating adder and register unit $25_1$ is preferably constructed similarly as those in the conventional frequency synthesis circuit 77 of FIG. 3. As such, accumulating adder and register unit $25_1$ includes adder 26a, which adds value X1 with the output of register 26b; the output of adder 26a is clocked into register 26b by clock signal CLK. As such, adder 26a and register 26b operate as an accumulator, as described above. The most significant four bits of the accumulated result in register 26b are latched into register 26c by clock signal CLK1 from clock control circuit 23, and are applied as the select input to multiplexer 26d, which receives each of the output clock phases from VCO 10 on bus TICK[15:0]. The selected clock phase is applied to one input of multiplexer 28.

Adder and register units $25_2$ through $25_4$ in frequency synthesis circuit 17 receive corresponding frequency select values X2 through X4 from frequency select logic 22. The relationship of values X2 through X4 to the value on lines FREQ[5:0] will be described below. Each of adder and register units $25_2$ through $25_4$ also receive the accumulated value from register 26b of accumulating adder and register unit $25_1$, as well as all sixteen clock phases from VCO 10, from which one clock phase is selected according to the accumulated result in each adder and register unit $25_2$ through $25_4$, and applied to an input of multiplexer 28. Adder and register units $25_2$ through $25_4$ are clocked by respective clock signals CLK2, CLK3, CLK4 from clock control circuit 23.

According to the preferred embodiment of the invention, clock control circuit 23 generates a select signal (preferably advancing in Gray code fashion) to multiplexer 28. This select signal selects the output of a corresponding adder and register units $25_1$ through $25_4$ for application to node T, which drives the clock input of toggle flip-flop 29a and also the clock input of clock control circuit 23 (thus advancing clock control circuit 23 to select the next clock signal and next select value, in turn). Toggle flip-flop 29a is arranged in toggle fashion by the inverted connection of its Q output to its data input (or, alternatively, by connection of its $\overline{Q}$ output to its data input), and thus toggles its stored state upon each rising edge transition at node T, which of course corresponds to a rising edge of a selected VCO clock phase from a corresponding one of adder and register units $25_1$ through $25_4$. The output of toggle flip-flop 29a, at node Z in FIG. 5, is applied to the clock input of second toggle flip-flop 29b. As such, rising edges at node Z will cause toggle flip-flop 29b to change state (given the inverted connection of its Q output to its data input); the Q output of toggle flip-flop 29b drives output clock signal COUT. As will be evident from the following description, the cascaded connection of toggle flip-flops 29a, 29b enables the reduction in the number of ticks, or VCO output clock phases, made available to frequency synthesis circuit 17, without reducing the resolution in the selection of the desired frequency.

In operation, as mentioned above, the value X1 on lines FREQ[3:0] determines the desired frequency of output clock signal COUT. For frequency synthesis circuit 17 of FIG. 5, considering that each of the four paths of adder and register units $25_1$ through $25_4$ must be activated once within a full cycle of output clock signal COUT, the highest frequency for output clock signal COUT is obtained with the value on lines FREQ[5:0] equaling 4($000100_2$). This is because the value accumulating within register 26b of adder and register unit 26b will be advancing by four within each cycle of output clock signal COUT, permitting each of the other adder and register units $25_2$ through $25_4$ to effect a transition for each of the three intervening unit values (such that a transition at node T occurs on each successive tick from VCO 10). In this case, the frequency of output clock signal $$COUT \text{ is } \frac{1}{4\Delta},$$

where Δ is the time between adjacent clock phases from VCO 10. In this example, in which sixteen clock phases are generated within one cycle of VCO 10, and in which VCO 10 is locked to reference clock CREF, the maximum frequency of output clock signal COUT is $4f_{ref}$, where $$f_{ref} = \frac{1}{\Delta}.$$

Conversely, the minimum frequency of output clock signal COUT is selected by the value 64 ($1000000_2$), which according to this architecture, is represented by the value $000000_2$ on lines FREQ[5:0]. In this situation, each path advances its selected VCO clock phase by the maximum of sixteen from one output clock signal cycle COUT to the next. In this case, therefore, the frequency of output clock signal $$COUT \text{ is } \frac{1}{64}f_{ref}.$$

And, as will be described in further detail below, sixty-one frequency values, including the minimum and maximum values, will be available for output clock signal COUT in this example.

Figure 6:
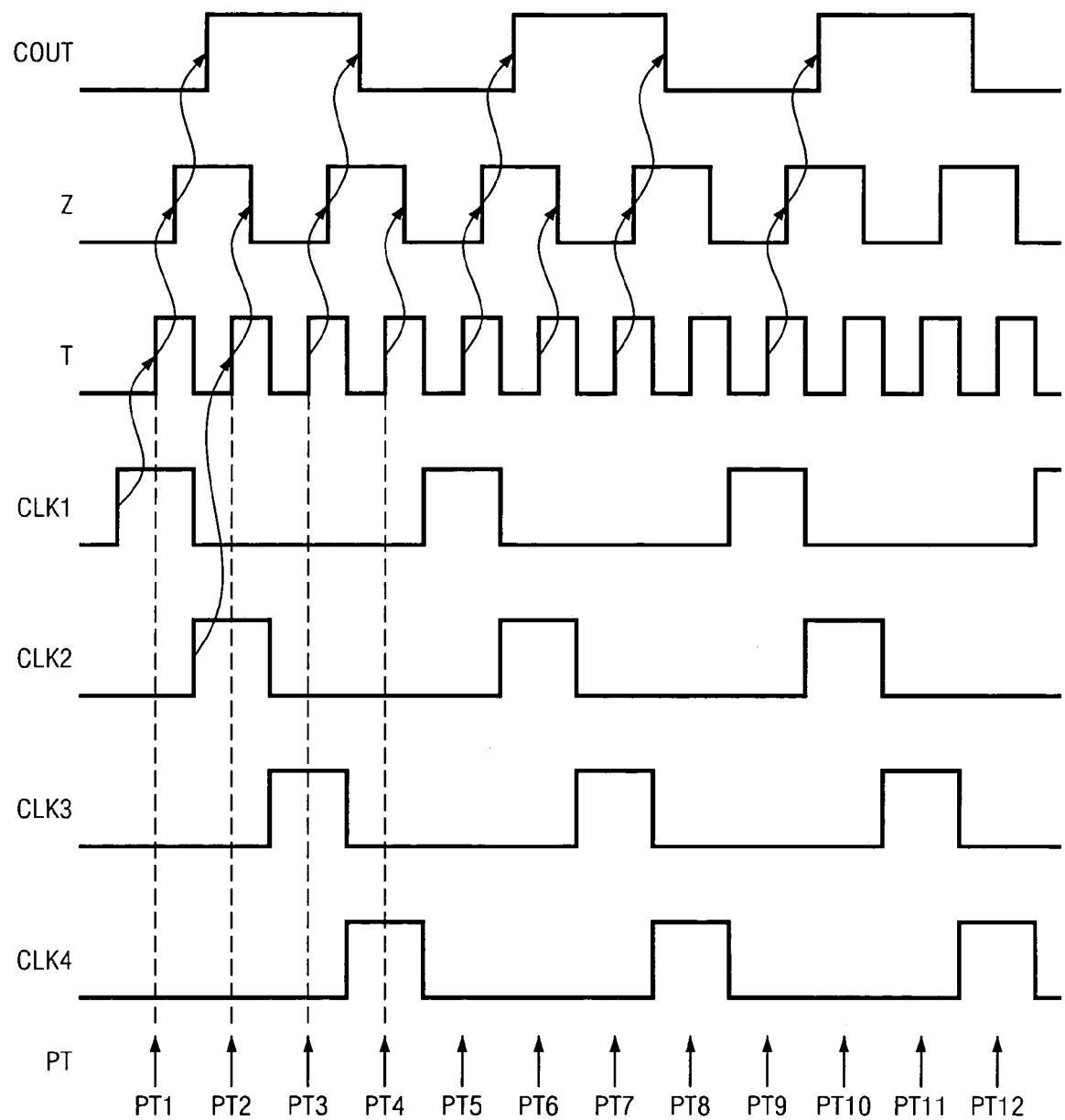
FIG. 6 is a timing diagram illustrating the operation of the frequency synthesis circuit of FIG. 5, according to the first preferred embodiment of the invention.

Referring now to FIG. 6, the operation of frequency synthesis circuit 17 according to this preferred embodiment will be described in detail. FIG. 6 illustrates the temporal relationship of clock signals CLK1 through CLK4 generated by clock control circuit 23, as well as the responsive generation of output clock signal COUT from the intermediate signal transitions. In FIG. 6, pulses PT illustrate transitions of the VCO clock phases selected by adder and register units 25, while lines T, Z, COUT illustrate the signals at those nodes in FIG. 5.

At pulse PT1, a transition of a VCO clock phase selected by accumulating adder and register unit $25_1$ occurs, during an active phase of clock signal CLK1. This causes node T to reflect the rising edge of the selected VCO phase, through the operation of multiplexers 26b, 28. This rising edge at node T clocks a high level into flip-flop 29a, in this example, which appears as a high level on line Z after a propagation delay. This transition at line Z clocks a high logic level into flip-flop 29b, which appears as a rising edge of output clock signal COUT after the propagation delay through flip-flop 29b.

At the end of the active period of clock signal CLK1 and the beginning of an active period of clock signal CLK2, multiplexer 28 next selects the output of adder and register unit 252, in this example. Upon the VCO phase selected by adder and register unit 252 making its transition, at pulse PT2, this rising edge propagates through multiplexer 28 and causes a transition of flip-flop 29a, returning its output at node Z to a low level. The falling edge of node Z has no effect on flip-flop 29b, other than to prepare it for a next clocking transition, which occurs, in this example, during the succeeding active period of clock signal CLK3, upon the transition of the selected VCO phase at pulse PT3. Again, this transition appears at node T (because of the selection of the output of adder and register unit $25_3$ by multiplexer 28), clocks flip-flop 29a to cause a low-to-high transition at its output, on node Z. This rising edge at node Z, at the clock input of flip-flop 29b, causes a change in state of output clock signal COUT. During the next successive active period of clock signal CLK4, the transition of the VCO clock phase that is selected by adder and register unit $25_4$ (pulse PT4)

toggles flip-flop 29a back to a low level, in preparation for the next clock phase selected by accumulating adder and register unit $25_1$, which will begin the next cycle of output clock signal COUT.

This operation of frequency synthesis circuit 17 continues, responsive to each selected VCO clock phase. And, as described above, the selection of these VCO phases, or ticks, is effected by the operation of accumulating adder and register unit $25_1$, as well as the other adder and register units $25_2$ through $25_4$.

The relationship of the values X1, X2, X3, X4 to the frequency select value FREQ[5:0], in this example, will now be described. As described above, adder and register unit $25_1$ includes an accumulator function, with its contents forwarded to each of the other adder and register units $25_2$ through $25_4$. In this example, the input value X1 applied to adder and register unit $25_1$ is constituted of the four least significant bits of the frequency control word FREQ[5:0]. According to the preferred embodiment of the invention, the determination of the other values depend upon the two least significant bits FREQ[1:0]. For example, if bits FREQ[1:0] equal 00, the full frequency control word FREQ[5:0] is evenly divisible by four, in which case signal Z can be generated to have four equal-length segments, and a duty cycle of exactly 50%. As such, in this case, the values X2, X3, X4 can be set, by frequency select logic 22, as follows:

$X2=FREQ/4$ $X3=FREQ/2$ $X4=X3+FREQ/4$

The "+" operator in these equations, and those following in this description, refers to an arithmetic sum (rather than as a logical OR). These values X2, X3, X4 thus correspond to the exact ¼, ½, and ¾ values of the frequency value FREQ, with value $X3=FREQ/2=FREQ[4:1]$ and value $X2=FREQ/4=FREQ[5:2]$.

In the event that FREQ[1:0]=01, the full value FREQ[5:0] is evenly divisible by neither two nor four. In this event, the duration of the output clock signal COUT phases will necessarily differ. For example, referring to FIG. 7, the time from time $t_0$ to time $t_2$ is preferably made longer, by one tick or interval Δ, than the time segments from time $t_2$ to time $t_4$; for example by lengthening the interval from time $t_0$ to time $t_1$ by this tick. In this case, therefore, the following values X2, X3, X4 are derived by frequency control logic 22:

$X2=FREQ/4+FREQ[1]$ $X3=FREQ/2+FREQ[0]$ $X4=X3+FREQ/4$

In the case that FREQ[1:0]=10, the value on lines FREQ[5:0] is evenly divisible by two but not by four. This can be generated by lengthening the time segments from time to to time t, and from time $t_2$ to time $t_3$ longer, by one tick or interval Δ, relative to the time segments from time $t_1$ to time $t_2$ and from time $t_3$ to time $t_4$. This will maintain the duty cycle of output clock signal COUT at 50%, because the interval from time to $t_0$ time $t_2$ is equal in duration to that from time $t_2$ to time $t_4$. In this case, therefore, the following values X2, X3, X4 are derived by frequency control logic 22 as follows:

$X2=FREQ/4+FREQ[1]$ $X3=FREQ/2$ $X4=X3+FREQ/4+FREQ[1]$

In the fourth case, in which FREQ[1:0]=11, again the values on lines FREQ[5:0] is divisible by neither two nor four. This can be implemented, in this example, by shortening the duration of the interval from time $t_3$ to time $t_4$ by one tick or interval Δ, which is accomplished by frequency control logic 22 deriving values X2, X3, X4:

$X2=FREQ/4+\{FREQ[1]\ OR\ FREQ[0]\}$ $X3=FREQ/2+FREQ[0]$ $X4=X3+FREQ/4+FREQ[1]$

The logic equations for generating values X2, X3, X4 can be generalized, and thus realized in frequency control logic 22, as follows:

$X2=FREQ[5:2]+\{FREQ[1]\ OR\ FREQ[0]\}$ $X3=FREQ[4:1]+FREQ[0]$ $X4=X3+FREQ[5:2]+FREQ[1]$

This generalized logic can, of course, be readily realized within frequency control logic 22 in frequency synthesis circuit 17, according to this embodiment of the invention. And additionally, the values X2, X3, X4 are static values, in that they depend only upon the incoming frequency select value FREQ[5:0], and do not change from cycle to cycle of output clock signal COUT.

It is instructive to compare the number of available frequencies that may be selected by frequency synthesis circuit 17, which has sixteen available clock phases or ticks from VCO 10, with the number of available output clock frequencies for the conventional frequency synthesis circuit 77 of FIG. 3, which has thirty-two VCO phases available. Referring back to FIG. 4, each of the transitions of output clock signal Z, at the output of flip-flop 79, corresponds to the occurrence T of a transition of a VCO clock phase as selected by one of the paths of frequency synthesis circuit 77 of FIG. 3. The number of available temporal locations for a given transition T is, of course, the number N of available VCO clock phases. There are N=32 such available phases for frequency synthesis circuit 77 of FIG. 3.

Figure 7:
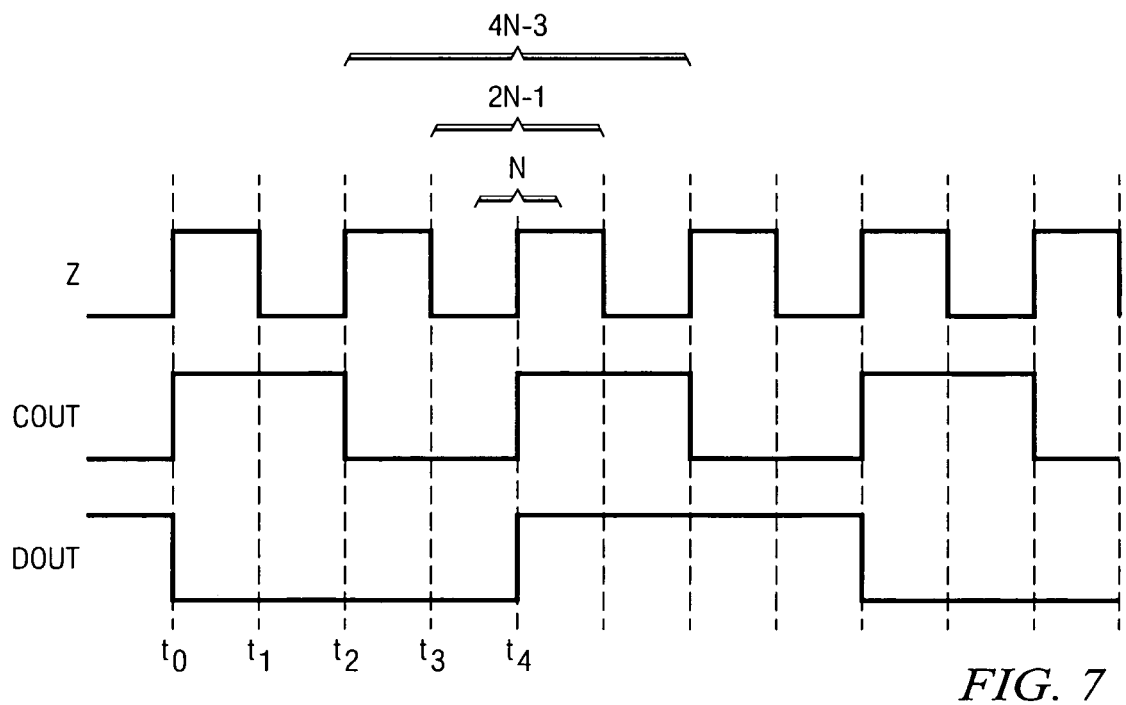
FIG. 7 is a timing diagram illustrating the relationship of various clock signals according to the second preferred embodiment of the invention.

One can similarly analyze the number of phases available for output clock signal COUT for frequency synthesis circuit 17 of FIG. 5, according to this embodiment of the invention. Referring to FIG. 7, if N represents the number of clock phases from which a rising edge transition of signal Z may be selected, the number of available clock phases from which a rising edge transition of output clock signal COUT may be selected is 2N−1 (one available phase must be reserved for the trailing edge of signal Z within this period). Accordingly, by generating the output clock signal COUT from the output of toggle flip-flop 29b (rather than the first toggle flip-flop 79 as in frequency synthesis circuit 77 of FIG. 3), one can effectively double the number of available clock phases for selection.

This property of a frequency synthesis circuit according to this invention is used, however, to reduce the number of clock phases required of VCO 10 without reducing the resolution of the output clock signal. As such, VCO 10 in the embodiment of the invention illustrated in FIG. 1 produces one-half as many output clock phases, or ticks (i.e., N=16, rather than 32). Because of the construction of frequency synthesis circuit 17 according to this embodiment of the invention, the generation of each transition of output clock signal COUT can be selected from thirty-one possibilities, thus providing substantially the same resolution as the conventional circuit of FIG. 3. However, because of this construction, VCO 10 can be constructed to have only eight stages (each differential stage generating two clock phases), rather than sixteen stages as in the conventional arrangement. And because it has been discovered, in connection with this invention, that the frequency error in flying-adder frequency synthesis circuits is dominated by circuit layout mismatch among the VCO stages, and that the magnitude of such mismatch correlates with the number of stages in the VCO, the reduction in the number of VCO stages enabled by this invention reduces the frequency error in the synthesized signal. The construction of frequency synthesis circuit 17 according to this embodiment of this invention attains such improved performance without substantially decreasing the resolution at which the output clock frequency can be selected.

Figure 8:
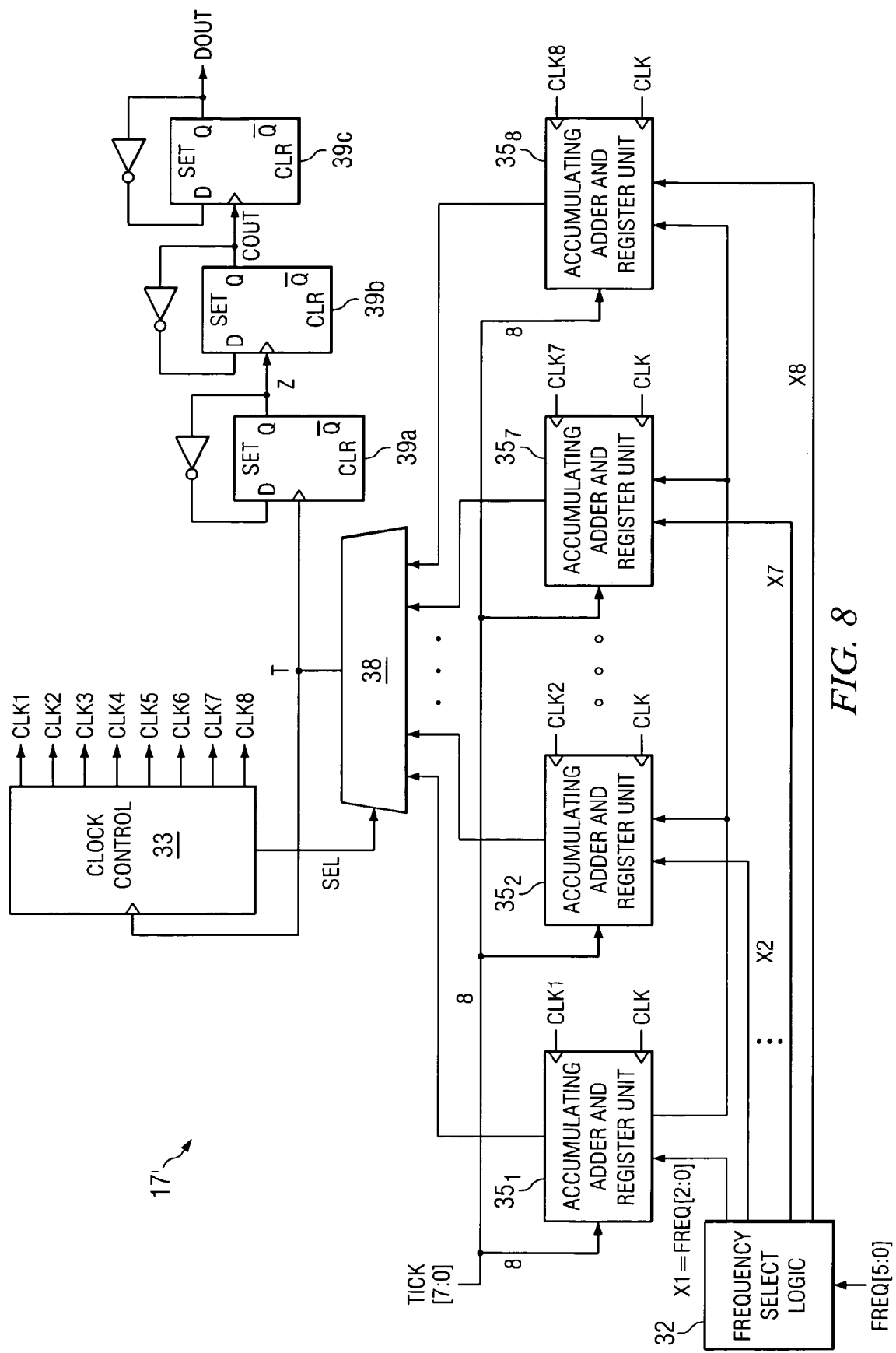
FIG. 8 is an electrical diagram, in block form, of a frequency synthesis circuit according to the second preferred embodiment of the invention.

Referring now to FIG. 8, frequency synthesis circuit 17' according to an alternative embodiment of this invention, and which may be readily substituted for frequency synthesis circuit 17 in clock generation circuit 2 of FIG. 1, will now be described in detail. Frequency synthesis circuit 17' further extends the concept of this invention, by providing an output clock signal DOUT having the same number of available frequencies as frequency synthesis circuit 17, but requiring even fewer VCO stages. In this example, the corresponding VCO need only provide eight output clock phases, from four differential VCO stages, which are received by frequency synthesis circuit 17' on eight bus lines TICK[7.0].

Frequency synthesis circuit 17' in this example includes eight paths, and as such includes eight adder and register units $35_1$ through $35_8$ (only four adder and register units $35_1$, $35_2$, $35_7$, $35_8$ are explicitly shown in FIG. 8). In this embodiment of the invention, accumulating adder and register unit $35_1$ includes an accumulator, which forwards its contents on to the other adder and register units $35_2$ through $35_8$ as before. Each of adder and register units $35_1$ through $35_8$ are clocked by a respective clock signal CLK1 through CLK8 from clock control circuit 33, and as such operate to each select a VCO clock phase, in sequence, in response to that respective clock signal. Accordingly, output multiplexer 38 has eight data inputs, one from each of the adder and register units $35_1$ through $35_8$, among which multiplexer 38 selects in response to select signals on lines SEL from clock control circuitry 33. Because eight paths, corresponding to the eight adder and register units $35_1$ through $35_8$, apply selected VCO clock phases to multiplexer 38, the eight VCO clock phase transitions selected by these eight paths successively define eight transitions at node T, at the output of multiplexer 38. As before, toggle flip-flop 39a and toggle flip-flop 39b are connected in sequence, with the clock input of flip-flop 39a connected to node T, and the clock input of flip-flop 39b connected to the output of flip-flop 39a (at node Z). Accordingly, the output of flip-flop 39b at node COUT generates a clock signal at half the frequency of the signal at node Z, with edges determined by the respective adder and register units 35. According to this embodiment of the invention, however, flip-flop 39c has its clock input connected to node COUT, and is arranged in toggle fashion (its Q output inverted and applied to its data input). The Q output of flip-flop 39c drives output clock signal DOUT. As such, each rising edge of signal COUT causes a transition of flip-flop 39c, such that output clock signal DOUT operates at half the frequency of signal COUT.

Referring back to FIG. 7, it is evident that the number of VCO clock phases that may be selected in deriving output clock signal DOUT, using frequency synthesis circuit 17', is approximately twice that available in the derivation of signal COUT. To recap, if N ticks are available for selection of the frequency of the signal at node Z, 2N−1 ticks are then available for deriving signal COUT. Accordingly, the number of ticks, or VCO phases, from which the transitions of output clock signal DOUT may be selected according to this embodiment of the invention is 4N−3 (the three possible phases subtracted from 4N accounting for the necessity of three ticks for the intervening edges of the signal at node Z in each cycle). Accordingly, the use of only four differential VCO stages, as communicated on bus TICK[8:0] to frequency synthesis circuit 17' of FIG. 8 still results in twenty-nine possible phases from which output clock signal DOUT may be selected.

Frequency synthesis circuit 17' according to this second preferred embodiment thus enables a greatly improved construction for VCO 10 in clock generation circuit 2, from the standpoint of reduced layout mismatch among the VCO stages. As discussed above, the extent of this layout mismatch correlates, in large part, to the number of stages in the VCO. Accordingly, the VCO stage mismatch, and thus the resulting frequency error, can be greatly reduced as a result of the construction and operation of frequency synthesis circuit 17' according to this preferred embodiment of the invention. This improved performance is attained with only minimal loss of resolution in the ability to select the desired output clock signal frequency, for the reasons discussed above.

Furthermore, it is known that the power dissipation in a conventional VCO also correlates strongly with the number of stages in the loop. Considering that the VCO power dissipation is a significant factor in the overall power dissipation of the clock generation circuit, this invention also results in substantial power savings.

Of course, additional flip-flops may be similarly connected in sequence to further enable the number of VCO stages to be reduced, for a given resolution, or alternatively to improved the frequency selection resolution for a given number of VCO stages. It is contemplated that those skilled in the art having reference to this specification will be readily able to realize the invention in these, and other, alternative implementations without departing from the true scope of this invention.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A clock generation circuit, comprising:
   a phase-locked loop for generating a plurality of clock phases, comprising
      a phase detector having a first input receiving a reference signal and a second input receiving a feedback signal, for producing an error signal at an output corresponding to a phase difference between the reference and feedback signals,
      a filter for low-pass filtering the error signal,
      a voltage-controlled oscillator for generating the plurality of clock phases at a frequency selected by the filtered error signal, wherein one of the plurality of clock phases is coupled to the phase detector as the feedback signal; and a flying-adder frequency synthesis circuit, comprising:
  a plurality of phase selection circuits, each phase selection circuit receiving the plurality of clock phases from the phase-locked loop and receiving a frequency select signal, and for selecting one of the plurality of clock phases responsive to the frequency select signal,
  an output multiplexer, having inputs coupled to the outputs of the plurality of phase selection circuits, for selecting each of its inputs for application to an output in sequence,
  a first toggle multivibrator, having a clock input coupled to an output of the output multiplexer, the first toggle multivibrator arranged to invert its state responsive to a transition at its clock input, and
  a second toggle multivibrator, having a clock input coupled to an output of the first toggle multivibrator, and having an output, the second toggle multivibrator arranged to invert its state responsive to a transition at its clock input;
wherein the voltage-controlled oscillator comprises:
  an even-numbered plurality of differential stages, each differential stage having positive and negative inputs and positive and negative outputs;
  wherein the positive and negative outputs of all but a selected one of the plurality of differential stages are connected to the negative and positive inputs, respectively, of the next adjacent one of the plurality of differential stages;
  and wherein the positive and negative outputs of the selected one of the plurality of differential stages are connected to the positive and negative inputs, respectively, of the next adjacent one of the plurality of differential stages.

2. A clock generation circuit, comprising:
a phase-locked loop for generating a plurality of clock phases; and
a flying-adder frequency synthesis circuit; comprising:
  a plurality of phase selection circuits, each phase selection circuit receiving the plurality of clock phases from the phase-locked loop and receiving a frequency select signal, and for selecting one of the plurality of clock phases responsive to the frequency select signal;
  an output multiplexer, having inputs coupled to the outputs of the plurality of phase selection circuits, for selecting each of its inputs for application to an output in sequence;
  a first toggle multivibrator, having a clock input coupled to an output of the output multiplexer, the first toggle multivibrator arranged to invert its state responsive to a transition at its clock input;
  a second toggle multivibrator, having a clock input coupled to an output of the first toggle multivibrator, and having an output, the second toggle multivibrator arranged to invert its state responsive to a transition at its clock input; and
  a third toggle multivibrator, having a clock input coupled to an output of the second toggle multivibrator, and having an output, the third toggle multivibrator arranged to invert its state responsive to a transition at its clock input.

3. A method of synthesizing one or more clock signals of a selected frequency and phase, comprising the steps of:
  generating a plurality of clock phases from a phase-locked loop;
  selecting one of the plurality of clock phases using each of a plurality of phase selection circuits;
  sequentially applying the selected clock phases from the plurality of phase selection circuits to a first toggle flip-flop to change its state;
  toggling a second toggle flip-flop responsive to a transition at an output of the first toggle flip-flop to generate the clock signal; and
  toggling a third toggle flip-flop responsive to a transition at an output of the second toggle flip-flop to generate the clock signal.

4. The method of claim 3, wherein the step of toggling the second flip-flop is performed responsive to transitions at the output of the first toggle flip-flop of a first polarity;
  and wherein the step of toggling the third flip-flop is performed responsive to transitions at the output of the second toggle flip-flop of the first polarity.

* * * * *